United States Patent [19]

Epstein et al.

[11] 4,032,765

[45] June 28, 1977

[54] MEMORY MODIFICATION SYSTEM

[75] Inventors: Jeffrey Earl Epstein, Laverne; Gary Victor Ruby, Pasadena, both of Calif.

[73] Assignee: Burroughs Corporation, Detroit, Mich.

[22] Filed: Feb. 23, 1976

[21] Appl. No.: 660,519

[52] U.S. Cl. ................. 235/153 AM; 340/173 BB
[51] Int. Cl.² .................. G11C 29/00; G06F 11/00
[58] Field of Search ............ 235/153 AM, 153 AC; 340/172.5, 173 R, 173 BB

[56] References Cited

UNITED STATES PATENTS

| | | | |
|---|---|---|---|
| 3,422,402 | 1/1969 | Sakalay | 340/173 BB |
| 3,588,830 | 6/1971 | Duda et al. | 340/172.5 |
| 3,659,275 | 4/1972 | Marshall | 340/172.5 |
| 3,753,244 | 8/1974 | Sumilas et al. | 340/172.5 |
| 3,768,071 | 10/1973 | Knauft et al. | 235/153 AM |
| 3,898,443 | 8/1975 | Smith | 235/153 AM |
| 3,934,227 | 1/1976 | Worst | 340/172.5 |

OTHER PUBLICATIONS

Houdek, Read–Only Patch Card, IBM Tech. Disclosure Bulletin, vol. 17, No. 6, Nov. 1974, pp. 1742–1743.

*Primary Examiner*—Charles E. Atkinson
*Attorney, Agent, or Firm*—Alfred W. Kozak; Nathan Cass; Kevin R. Peterson

[57] ABSTRACT

A system for modifying the output of individual bits of a fixed memory such as a ROM. Means are provided for recognizing the address of bit-locations requiring modification. The recognized addresses are organized into (a) those requiring the addition of a logic 1 bit or (b) those requiring deletion of a logic 1 bit. An output-data control package combines this information logically with the data bit existing in memory to provide a corrected data output bit on the required line of the ROM output bus. The system is also adaptable to "word-oriented" ROM's such that an improper word in memory may be modified to provide a corrected output word from the ROM.

9 Claims, 4 Drawing Figures

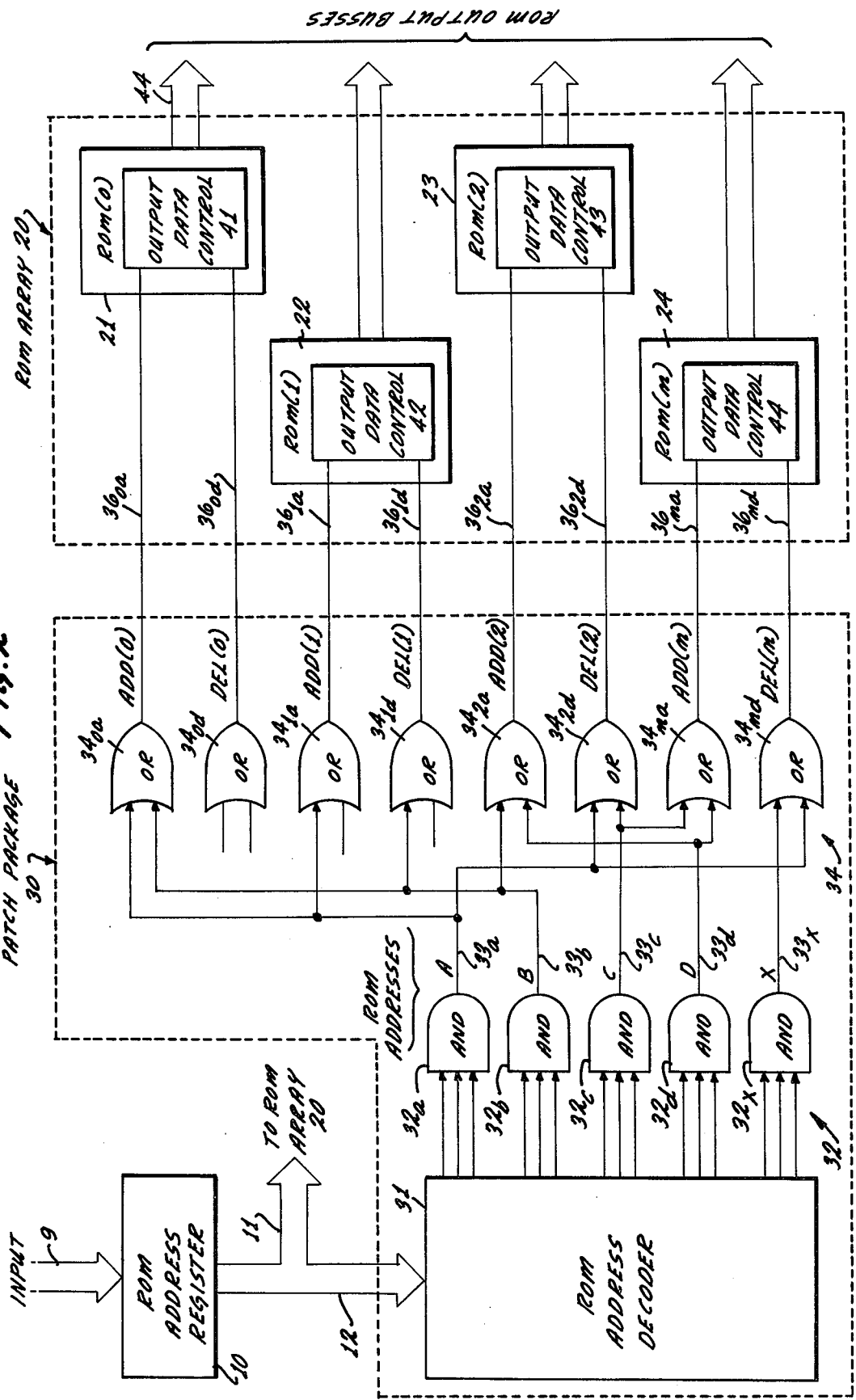

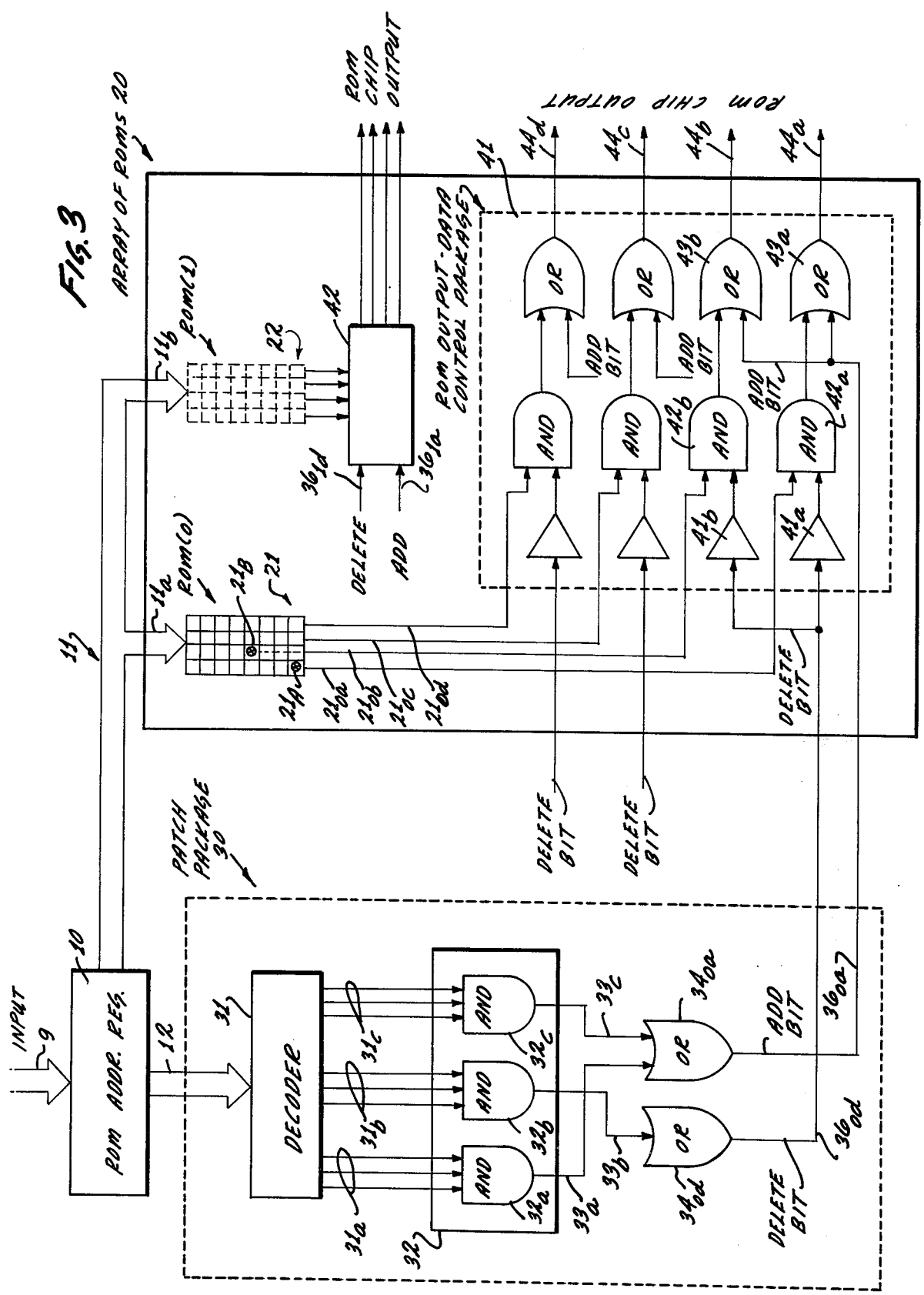

MEMORY MODIFICATION SYSTEM

FIELD OF THE INVENTION

This invention relates to memory system for data processing equipment and particularly to methods for storing and recalling data in a reliable fashion even though certain bits or portions of the memory storage device are improper and/or desired to be other than what they are. The invention also relates to systems and methods for altering the output of data stored in a read only storage device (of the permanent or unalterable type or even programmable ROMs or PROMs,) wherein, once the data is stored, it is not economically feasible to change or alter the data stored therein.

BACKGROUND OF THE INVENTION

Much of the memory storage devices produced for use in modern computer systems, mini-computers and micro-computers in the present, make use of read only memories or ROMs. Their fabrication is such that, once produced by large scale manufacturing processes, there is no economically feasible way to alter the contents of any work or any individual bit therein in a practical manner without destroying the memory because ROMs today are made in the form of integrated circuits. They generally include a large number of ROM memories in an array, and there is a significant probability that one or more of the data storage locations may need alteration.

Thus, after final tests are made on such a memory, it is possible to determine which memories are completely perfect in all respects and which memories contain data-bit locations which are improper and which would output undesired or inaccurate data. The problem arises as to whether to scrap such memory arrays which are incorrect, often to a very large cost, or to do something to rehabilitate those portions of the memory which have inaccurate or defective portions.

These ROMs, or memory arrays of ROMs, are generally manufactured in large scale batch techniques which involve very considerable expense. Generally only a moderate percentage of such manufactured memory devices turn out to be perfect, and thus the question of rehabilitation of the imperfect devices, or the data therein, becomes of some importance. Thus a number of efforts have been made in the prior art to make such defective memories into usable units which will not have to be scrapped or thrown away. This concept can also apply to "Programmable ROMs" when the reprogramming costs for each ROM are excessive for minor changes.

Summary of the Invention

The present invention involves a system which is organized to apply to known "defective" bit locations in an unalterable memory in order to provide that, when such defective bit locations are addressed, the memory output line from the bit will be so controlled as to provide the correct and the desired output data on that specific line of the memory output. Broadly here, the concept of "defective" bit locations means that there is data involved which is desired to be modified.

In the present system a "Patch Package" is used in conjunction with a memory having defective bit locations such that the Patch Package will sense any address which requests data from a memory location having a defective bit.

The Patch Package may comprise a Decoder, which is connected to the ROM Address Register, the Decoder working in conjunction with a plurality of AND gates wherein each AND gate is responsive to a specific address which calls for data from the defective bit location. The outputs of the AND gates are wired to a pair of OR gates in order to distinguish whether the corrective action should be that of "adding" a bit of information of the defective location in the memory, or whether that of "deleting" a bit from a defective location in memory.

There is further provided an "Output-date Control Package," which is placed between the output lines of the addressed bit location and the memory chip output lines. The "Add-bit" line and the "Delete-bit" line of the Patch Package work in conjunction with the Output-data Control to insure that any defective or inaccurate bit locations which are addressed, are properly compensated for and corrected by means of the Output-data Control which provides the bus output from the ROM array.

Thus, sometimes after a computer system is built, it is desirable to correct and or improve its hardware performance without incurring excessive costs to the machines in the field and the machines presently being manufactured. The costs may involve extensive documentation, physical rework of the hardware, and also the amount of hardware which may have to be scrapped. The scrapped material may also include the manufacturing inventory of existing parts which could represent a substantial overall cost factor.

Now if the storage memory system involves the use of high speed ROMs (read only memories) in the form of intergrated circuit chips, these constitute very expensive items, and the need to alter those items could result in problems since these ROM chips are not normally alterable without being destroyed.

One way of improving the performance of a defective ROM chip is to add in a faster ROM or even a faster equivalent, such as a RAM (random access memory).

In one embodiment of the present invention, the method is to add a Patch Package to the existing machine hardware in order to effectuate an alteration in selected lines of the ROM outputs. Usually it is desirable to alter only a few bits within the various words and usually the works are randomly ordered.

The present method described herein allows the alteration of a few bits here and there as required and in a rather economically simple and easy fashion.

When the ROM bits are grouped into Fields, it is desirable to have various bits of the group capable of being affected by Disable and/or Expand Signals. The effect of this is to Delete or to Add bits as required. If the selected address bit is True at the desired read-out time and it is required to have it be False, then a Delete Bit is required. Likewise to change a False to a True, an Add bit is required. This is accomplished by an Output-data Control which is provided for each ROM having specific address locations whose contents must be modified.

The added Output-data Control for each memory bit to be modified requires an additional gate or two but this is very small in cost and trouble considering the scrappage cost of losing an entire memory array. This is also much cheaper and easier than using a flexible and expensive Read/Write Control Storage (RAM) mechanism. Also with the use of a RAM there is an excessive amount of overhead logic control required.

In the present system, an address input to a ROM Address Register is fed by buses to the ROM array which is a conglomeration of individual ROM memories arrayed on a chip.

In addition, the ROM Address Register signal is fed to an Address Decoder and a group of AND gates which select out and identify those addresses which refer to each defective bit in the ROM memory array. A recognition signal of a defective bit location is conveyed from the AND gate group to a pair of OR gates, one gate of which controls those defective bit locations which will require the addition of a bit, and the other OR gate which controls those defective bit locations which will require the deletion of a data bit.

Each Read Only Memory in the array of ROMs is provided with an Output-data Control package so that each bit location of the ROM which has been addressed will convey its output through the Output-data Control package. This control package, in combination with the Add Bit and Delete Bit signals from the Patch Package, will operate to alter any defective bits on a given output line in order that the correctly desired bit will appear on the ROM array output lines.

BRIEF DESCRIPTION OF THE DRAWINGS

FIG. 2 is a schematic drawing of one embodiment of the system showing in detail the elements of the Patch Package and how it provides outputs to the Output-data Control of each ROM chip.

FIG. 3 is an overall system diagram showing another embodiment, with more detail, of aspects of the array of ROM chips, the Output-data Control circuitry and their relation to the Patch Package.

DESCRIPTION OF THE PREFERRED EMBODIMENT

Figure 1:
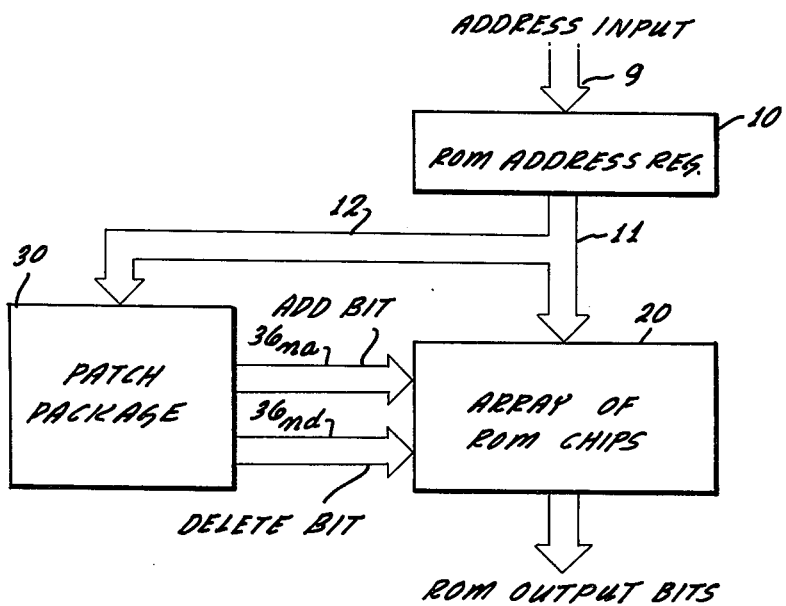
FIG. 1 is a block diagram of the overall system showing how the Patch Package senses the address of a bit location having undesired contents and provides, to the array of ROM chips, the necessary add or delete bits to correct and adjust the final pattern of the output bits from the array of ROMs.

Referring to FIG. 1 there is seen an overall block diagram of the system for modifying a ROM array output without replacing all or part of the ROM. An address input bus 9 feeds address data to a ROM Address Register 10. The output of the ROM Address Register 10 proceeds along a bus 11 to an array of ROM chips 20, so that specific data bit locations, as addressed by the address input, may be selected in a given ROM chip. Another part of the ROM Address Register output is bus 12 which conveys address data to the Patch Package 30, which has two output lines $36_{na}$ and $36_{nd}$ which respectively provide signals from Add Bit, that is to say to turn a false (logic 0) signal into a true (logic 1) signal, and a Delete Bit which will turn a true signal into a false signal.

FIG. 2 shows in greater detail the circuitry of the Patch Package 30 and group of Output-data Control packages 41, 42, 43, 44, which are associated with individual ROMs on the array 20.

The Patch Package 30 includes the ROM Address Decoder 31 which has a series of output line groups responsive to any selected address desired to be modified. These groups of selected address lines from the Decoder 31 provide input lines to a group 32 of ANd gates, designated as $32_a$, $32_b$, $32_c$, $32_d$, and $32_x$.

Thus a given ROM address A would be recognized by AND gate $32_a$ when the three input lines were activated be Decoder 31. Likewise, other specific addresses would be recognized by specific AND gates such as ROM address "X," which would be recognized by AND gate $32_x$.

The output lines of each individual AND gate are designated $33_a$, $33_b$, $33_c$, $33_d$, $33_x$. These outputs of the AND gates are selectively wired to the inputs of various OR gates of the OR gate group 34, which constitutes a series of OR gates $34_{oa}$, $34_{od}$; $34_{la}$, $34_{ld}$; $34_{2a}$, $34_{2d}$; $34_{na}$, $34_{nd}$.

These OR gates are organized so as to constitute one pair of OR gates for each ROM chip in the ROM array 20. For example, OR output lines $36_{oa}$ and $36_{od}$ convey signals to Output-data Control 41 of ROM (0) designated as element 21 and having an output bus 44.

Likewise OR output lines $36_{la}$ and $36_{ld}$ convey signals to Output-data Control 42 of ROM (1) designated as element 22. Likewise OR output lines $36_{2a}$ and $36_{2d}$ connect to Output-data Control 43 of ROM (2) designated as element 23; and OR output lines $36_{na}$ and $36_{nd}$ connect to Output-data Control 44 of ROM (n) designated as element 24.

Each of the ROM chips in the array are seen to have output bus lines which convey signal information outside of the ROM array 20.

Referring again in FIG. 2 to the AND group 32, it will be seen that the outputs of each of the AND gates are connected as input to one or more of the OR gates of the OR gate group 34 in order to provide signal information that a selected address location will require the addition of a data bit or the deletion of a data bit.

Further detail on the ROM chips 21, 22, 23, 24, etc., and the Output-data Control for each ROM chip such as control 41, 42, 43, 44, etc., will be discussed in greater detail in connection with FIG. 3.

Referring to FIG. 3, the overall system is seen in greater detail showing the array of ROMs 20 having a plurality of individual ROM chips 21, 22, etc., and wherein each ROM chip has an Output-data Control package 41, 42, etc. to work in conjunction therewith.

Referring to FIG. 3 the ROM Address Register 10 has an output bus 11 which is fed to ROM 21 through bus lines $11_a$, and to ROM 22 through bus lines $11_b$.

ROM 21, for example, is shown in diagrammatic form as a series of bit locations, wherein for example, bit locations $21_A$ and $21_B$ are locations which are either improper or defective in data-carrying capacity and which require modification of the data contained therein.

Lines $21_{oa}$, $21_{ob}$, $21_{oc}$, and $21_{od}$ are output lines which read out the contents of any given bit location as it is addressed by the ROM Address Register 10.

Each output readout line from ROM 21 is fed through the Output-data Control package 41, such as, for example, output line $21_{oa}$ which forms one input to AND gate $42_a$; while the other input to AND gate $42_a$ is from the Delete Bit line $36_{od}$ (through the inverter $41_a$). The output of AND gate $42_a$ is fed to OR gate $43_a$; the other input to OR gate $43_a$ comes from the Add Bit line $36_{oa}$ which results in an output line from OR gate $43_a$ which is conveyed from within the chip to the outside and designated as line $44_a$.

Since the contents of the data in address bit $21_B$ also requires modification, it is seen that the line $21_{ob}$ is conveyed to the Output-data Control package 41 where it is subjected to a similar gate and inversion in order to form the final output line $44_b$. Line $21_{ob}$ is fed as input to AND gate $42_b$ whose other input is from Delete Bit line $36_{od}$ (through inverter $41_b$). The output of AND gate $42_b$ is wired to the input of OR gate $43_b$ which also has an input from Add Bit line $36_{oa}$, then OR gate $43_b$ provides an output line $44_b$ which conveys the signal outside the ROM chip.

Now if, for example, the other two columnar bit positions of ROM 21 were completely proper, then there would be no need for lines $21_{oc}$ and lines $21_{od}$ to be modified in the Output-data Control package 41. Thus the final ROM array output lines $44_c$ and $44_d$ would directly reflect the signals on ROM chip output lines $21_{oc}$ and $21_{od}$ without the need for alteration by the Output-data Control package 41 and its internal gates.

Again in non-volatile 3 it is seen that a ROM 22 is provided with output lines feeding to an Output-data Control package 42 which has input signal lines from the Delete Bit line $36_{ld}$ and from the Add Bit line $36_{la}$. These latter 2 lines will be also seen in FIG. 2 as the OR-pair which connect to ROM 22 via Output-data Control 42. The Output-data Control Package or Circuit 41 is made up of a series of "line control units," each of which unit is devoted to the handling of a particular output line from the read only memory; for example ROM 21 has four output lines, $21_{oa}, 21_{ob}, 21_{oc}$, and $21_{od}$, and each of these lines passes through a separate line control unit made up of an AND gate, an OR gate and an inverter, such as inverter $41_a$, AND gate $42_a$, and OR gate $43_a$ to output line $44_a$.

Referring to one embodiment shown in FIG. 3 it will be seen that an array 20 of ROM memory chips 21, 22, etc., is provided. In ROM chip 21 there may be seen address bit locations $21_A$ and $21_B$ which represent memory locations which are defective or which have a content which is desired to be modified when such bit locations are read out of the ROM 21.

When the input bus 9 is presented with a memory address for ROM 21, for example, to access the contents of memory locations $21_A$, the ROM Address Register receives the specific address for ROM location $21_A$ and conveys this information via bus 12 to Decoder 31. The ROM Address Register information is also conveyed on bus 11 and $11_a$ to ROM 21 in order to select out the contents of location $21_A$.

Figure 4:
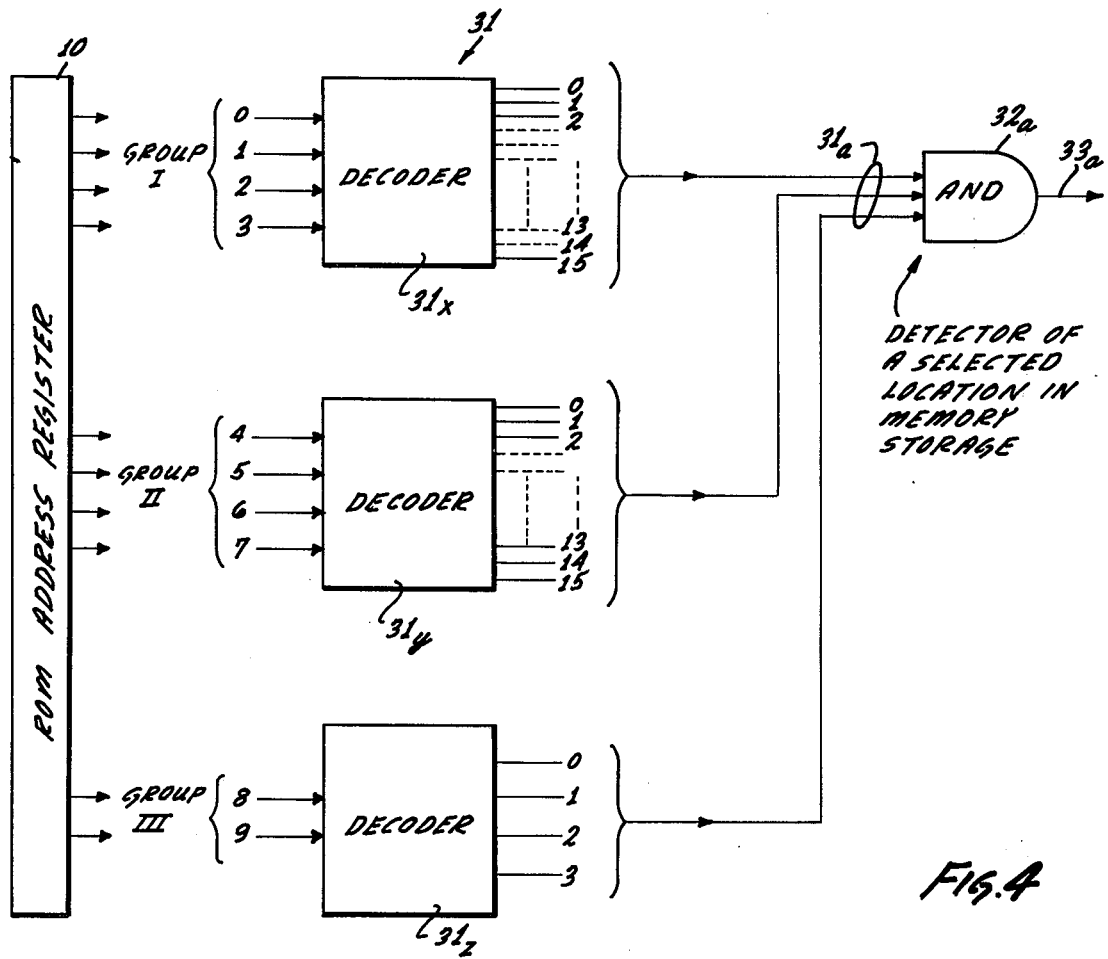
FIG. 4 is a schematic showing in more detail how the Address Decoder is wired to a Detector for address recognition of a specified memory storage location whose output is required to be modified.

Assuming, for example, that the ROM Address Register carries 10 bits, and assuming that these 10 bits are broken down into two groups of 4-bits each one group of 2-bits: this may be better understood by reference to FIG. 4 wherein the Decoder 31 is split into three portions $31_x, 31_y, 31_z$. In group I, the address bits 0 through 3 are decoded in order to select one of 16 outputs which are conveyed to AND gate $32_a$. Likewise, for group II, the address bits 4 through 7 can select one of 16 output lines to be conveyed to AND gate $32_a$. In group III, the two input bits 8 and 9 can select one of four output lines of the decoder portion $31_z$.

The input lines to AND gate $32_a$ are selected to reflect the address location $21_A$ of ROM 21. Thus, when the input bus 9 and the ROM Address Register 10 receive the address bit location $21_A$, each input line to the AND gate $32_a$ will be "true" and provide true output on line $33_a$.

Referring to FIG. 3 and the AND gate group 32, it will be seen that other AND gate such as $32_b$ and $32_c$ etc., are provided for each address bit location in memory which it is desired to modify.

If, for example, in FIG. 3, the data in bit location $21_A$ is a logical 0 which is desired to be read out as a logical 1, then, when the bit location $21_A$ is read out from ROM 21, there will be provided a logic 0 signal on line $21_{oa}$. The logic 0 signal on line $21_{oa}$ is fed to the input of AND gate $42_a$. Now since the output signal along the Delete Bit line $36_{od}$ is a logical 1 which is inverted by inverter $41_a$ to a logical 0, then AND gate $42_a$ conveys a logical 0 output to the OR $43_a$. However, OR gate $43_a$ receives a logical 1 input or Add Bit from OR gate $34_{oa}$, and thus the output line $44_a$ reflects a logical 1 on its output, as was desired (even though location $21_A$ contained of logical 0).

Referring to FIG. 3 and the address bit location $21_B$ thereof, let us assume that inadvertently or defectively there resides a logical 1 bit in location $21_B$. It is desired that this logical 1 bit be Deleted, to provide a logical 0 output.

When the ROM Address Register 10 receives the digital address corresponding to location $21_B$, it is decoded by Decoder 31 and causes AND gate $32_b$ to provide a logic 1 signal on output line $33_b$ which is conveyed to the input of OR gate $34_{od}$. No signal is provided to OR gate $34_{oa}$ and thus there is no output signal on the Add Bit line $36_{oa}$.

The Delete Bit signal of a logic 1 on line $36_{od}$ is conveyed to inverter $41_b$ to provide a logic 0 signal at the input of AND gate $42_b$. The other input line to AND gate $42_b$ is the logic 1 signal on input line $21_{ob}$. Thus, AND gate $42_b$ has one input at logic 0 and one input at logic 1 (which could be called a "disable" signal to the output line $21_{ob}$ of the ROM 21) so that the output AND gate $42_b$ is a logic 0 which is inputted to OR gate $43_b$.

Now it will be seen that OR gate $43_b$ has a logic 0 signal from AND gate $42_b$ and also has a logic 0 signal input from the Add Bit line $36_{oa}$; thus, the output of the ROM clip at line $44_b$ is now a logic 0 instead of the logic 1 signal which was residing at bit location $21_B$ of ROM 21.

Thus, it will be seen that the Patch Package 30 provides means for detecting the address of a bit location which is required to be modified, and the Patch Package is further combined with the Output-data Control 41 to determine whether that particular address bit location is to be modified from a true to a false output (Delete Bit) or whether that location is to be modified from a false to a true output (Add Bit).

In a sense it could be looked at from the viewpoint that a particular ROM memory will have one or more of its output lines either disabled or added to (expanded).

Referring to FIG. 2 there is seen another versatile embodiment wherein a series of AND output lines $33_a, 33_b \ldots 33_x$ provide inputs to the OR gate Group 34.

The OR gate Group 34 is organized in pairs to provide an ADD bit and a DELETE bit to each ROM in the array 20 as follows:

| Gate | Line | Function | ROM | Element No. |
|---|---|---|---|---|
| OR $34_{oa}$ | $35_{oa}$ | ADD | ROM(0) | 21 |
| OR $34_{od}$ | $35_{od}$ | DELETE | ROM(0) | 21 |
| OR $34_{1a}$ | $35_{1a}$ | ADD | ROM(1) | 22 |
| OR $34_{1d}$ | $35_{1d}$ | DELETE | ROM(1) | 22 |
| OR $34_{2a}$ | $35_{2a}$ | ADD | ROM(2) | 23 |
| OR $34_{2d}$ | $35_{2d}$ | DELETE | ROM(2) | 23 |
| OR $34_{na}$ | $35_{na}$ | ADD | ROM(3) | 24 |
| OR $34_{nd}$ | $35_{nd}$ | DELETE | ROM(3) | 24 |

Referring to Patch Package 30 as seen in FIG. 2 the output $33_a$ (of AND gate $32_a$) is wired as input to:

i. OR gate $34_{oa}$ — so as to convey an ADD bit on line $36_{oa}$ to ROM 21 via Output-data Control 41 (when a specified bit location in ROM (0) is addressed).

ii. OR gate $34_{1a}$ — so as to convey an ADD bit on line $36_{1a}$ to ROM 22 (when a specified bit location in ROM (2) is addressed).

iii. OR gate $34_{2d}$ — so as to convey a DELETE bit on line $36_{2d}$ to ROM 23 via Output-data Control 43 ( when a specified bit location in ROM (2) is addressed).

iv. OR gate $34_{nd}$ — so as to convey a DELETE bit on line $36_{nd}$ to ROM 24 via Output-data Control 44 (when a specified bit location in ROM ($n$) is addressed).

Likewise AND gate $32_b$ will cause (upon receipt of a specified address):
 an ADD bit to ROM 21 (ROM 0)
 a DELETE bit to ROM 22 (ROM 1)
 an ADD bit to ROM 23 (ROM 2)
Likewise AND gate $33_c$ will cause:
 a DELETE bit to ROM 23 (ROM 2)
 an ADD bit to ROM 24 (ROM $n$)
Likewise AND gate $32_d$ will cause:
 an ADD bit to ROM 23 (ROM 2)
 and ADD bit to ROM 24 (ROM $n$)
Likewise AND gate $32_x$ will cause:
 a DELETE bit to ROM 24 (ROM $n$)

Thus, taking an array of ROMs of which various ROM chips have bit location which are desired to be modified, it is then possible by means of the Patch Package and the Output-data Control package to insure that the ROM chip output is modified to the desired pattern of logic signal output.

Having thus described a relatively efficacious and inexpensive system for rehabilitating the inadequacies in an array of ROM memory chips, and which is also applicable to any desired modification of memory outputs, the following claims are made herein.

What is claimed is:

1. In a system for modifying the data output of the data in a specified bit-space of memory storage, the combination comprising:

a. a read only memory store of addressable data-bit locations;

b. means for recognition of address locations of data having contents which are desired to be modified;

c. means for providing an ADD bit or a DELETE bit control signal to the output data accessed from said address locations having contents to be modified, said means for providing a control signal being activated by said means for recognition upon detection of an address involving a data-bit location whose data content is to be modified;

d. an Output-data Control Circuit for receiving control signals from said means and ADD bit or a DELETE bit signal, said Output-data Control Circuit including:

d1. an input line carrying data derived from a selected bit-space of said memory store;

d2. logic modifying means on said input line capable of modifying the data-bit derived from said bit-space;

d3. said logic means being responsive to a control signal from said means for providing an ADD or DELETE bit control signal;

e. and wherein said Output-data Control Circuit provides a logic modifying means for each output line from each bit location in memory which may be desired to be modified;

f. said means for recognition includes address lines wired to a plurality of AND gates, each of said AND gates wired for signal activation upon the presense of a specifically known address signal addressing a specified memory store location which is desired to be modified, whereby activation of a specified AND gate will initiate said means by providing a control signal.

2. The system of claim 1 wherein said means for providing an ADD bit or DELETE bit control signal, includes a plurality of OR gates having output lines for disabling or enabling the read-out signal on the output line of a specified address-location in said memory store, a specific one of said OR gates being activated by one of said AND gates when said AND gate detects a specified address signal.

3. The system of claim 1 including said Output-data Control Circuit, wherein said means for providing an ADD bit or a DELETE bit control signal includes a pair of OR gates responsive to the appearance of a decoded selected address at one of said AND gates, whereby one of said OR gates will provide a suitable signal for logical combination with said Output-data Control Circuit for modifying the output of the contents of a selected address location in said memory store.

4. The system of claim 3 wherein said Output-data Control Circuit includes a plurality of individual line control units, each line control unit being connected to the output line of a memory location desired to be modified, each of said line control units including an inverter, an Output AND gate and an Output OR gate, and wherein one of said pair of OR gates provides a DELETE signal to said inverter and the other of said pair of OR gates provides an ADD signal to said Output OR gate of said line control unit.

5. A system for modifying the output data content of selected address locations of a memory store, the combination comprising:

a. a ROM memory including a plurality of individual read only memories;

b. a ROM address register connected to said ROM memory for addressing of data in said ROM memory and for conveying address information to a Patch Package;

c. A Patch Package including:

c1. decoding means including a decoder having a plurality of AND gates connected to said decoder where each of said plurality of AND gates is wired to said decoder so as to detect the appearance of an address defining a specific bit location in said main memory;

c2. a pair of OR gates connected to each of said plurality of AND gates, said OR gates providing a first control signal designated an ADD bit signal and a second control signal designated DELETE bit signal, said first and second control signal being connected to an Output-data Control Package;

d. an Output-data Control Package connected to each ROM of said ROM memory which has bits desired to be modified, said Output-data Control Package including:
   d1. a line control unit for each output line of a selected ROM desired to be modified;
   d2. each line control unit including an inverter, an AND gate and an OR gate;
   d3. said AND gate having one input for receiving data from said selected address bit location and a second input from said inverter wherein said inverter receives a DELETE bit control signal from said pair of OR gates in said Patch Package;
   d4. said OR gate having one input from said AND gate and a second input from the ADD bit control signal line from said pair of OR gates in said Patch package;

e. whereby when a selected AND gate of said Patch Package recognizes an address of a memory bit location to be modified, it will activate one of a pair of said pair of OR gates to present a control signal to said Output-data Control Package and the specific control line unit in order to modify the data read out of the selected bit location of the ROM memory desired to be modified.

6. In a system for modifying the data output of a read only Memory Store having bit-addressable data-storage locations and an output bus, the combination comprising:

a. a memory store comprising an array of read only memories, each ROM having bit-locations organized into rows and columns, each column of said read only memories having an output line;

b. a ROM address register for receiving a memory address, said ROM address register connected to an address bus for each of said array of read only memories;

c. a line control unit connected to the output line of each ROM having data bit locations whose data is desired to be modified, said control unit including means to modify the data on said ROM output line;

d. an Output-data Control Package which includes a line control unit for each output line of each ROM which it is desired to modify,
said Output-data Control Package having a plurality of line control units, each control unit of which will receive a control signal after the detection of the presence of a ROM address which has a data-bit which need altering;

e. a Patch Package, connected to said ROM address register, said Patch Package including:
   e1. decoding means including a partial decoder and a plurality of AND gates, each AND gate individually responsive to a specified memory address;
   e2. a first and second OR gate;
   wherein said decoder and a plurality of AND gates are wired to recognize the presence of an address having an undesired data content and said OR gates includes means to provide an output control signal to said line control unit so as to add a bit to the said ROM output line if none is present or to delete a bit from said line if such a bit is present.

7. The system of claim 6 wherein said means to modify the data on said ROM output line includes:

f. an inverter connected to receive receive DELETE bit control signals from said first OR gate in said Patch Package;

g. an AND gate having a first input from the data addressed in the specified bit-location in said ROM, and a second input from said inverter;

h. an OR gate having a first input connected to receive ADD bit control signals from said second OR gate in said Patch Package, and having a second input from the output signal of said AND gate to clause;

i. an output line from said OR gate of clause (h) to carry the correct data signal.

8. A memory system for modifying, when a known bit location having incorrect contents is addressed, the output of said bit location into the correct data form, comprising:

a. a non-violate read only memory for storing data bits in a multiplicity of bit locations therein, each of said bit locations having an output data line, and wherein the addresses of the incorrect bit locations are known;

b. means for detecting the address of those bit locations addressed which are known to be incorrect; and c. means for delivering add bit control signal or delete bit control signals signals to the output data line of any selected bit location which is detected by said means for address detecting, said means for delivering being responsive to the detection of the address of an incorrect data bit by said address detection means;

d. Output-data Control means connected to the output data line of a defective bit location and operable to place a 1 bit or to delete a 1 bit on the said output line of said selected bit location, in response to control signals from said means for delivering.

9. A memory storage modification system for operation with a fixed memory such as a plurality of ROMs in a ROM array, said system comprising:

a. a Read only Memory having known data-bit locations holding undesired data content;

b. a ROM Address Register;

c. a Patch Package Module including:
   c1. an Address Decoder for distinguishing address-bit positions which contain undesired data in said ROM, said Address Decoder having a plurality of AND gates, including one AND gate for each undesired content bit location in said ROM, each of said AND gates having input lines for recognizing an address of a particular location in said ROM; and
   c2. a plurality of OR gates including a first and second OR gate for each data-bit location desired to be modified, said OR gate having output control signals respectively designated as the DELETE BIT line and ADD BIT line, said first and second OR gates connected to said Address Decoder and responsive to detection of a selected address to provide a control signal to a means for inserting data;

d. means for inserting desired data into the read-out output line of a selected bit-location when such bit is read out, said means including:
   d1. an inverter having an input from the said DELETE BIT line;
   d2. and AND gate having a first input from the selected bit-location of an addressed data bit in said ROM, and having a second input from said inverter;

d3. an OR gate having a first input derived and said AND gate and a second input derived from said ADD bit line whereby the output of said OR gate will provide the proper data bit in place of the contents of the addressed data-bit location which had undesired data content.

* * * * *

Page 1 of 2

UNITED STATES PATENT AND TRADEMARK OFFICE
CERTIFICATE OF CORRECTION

PATENT NO. : 4,032,765
DATED : June 28, 1977
INVENTOR(S) : Jeffrey E. Epstein and Gary V. Ruby It is certified that error appears in the above-identified patent and that said Letters Patent are hereby corrected as shown below:

Col. 1, line 5, change "system" to --systems--.
       line 24, change "work" to --word--.
       line 37, change "to", first occurrence, to --at--.
       line 59, change "the" to --that--.
Col. 2, line 5, change "the" to --a--.
       line 9, change "of" to --to--.
       line 12, change "Output-date" to --Output-data--.
       line 34, change "intergrated" to --integrated--.
       line 35, change "those" to --these--.
       line 46, change "works" to --words--.
Col. 3, line 30, delete "the", second occurrence.
       line 58, change "from" to --for--.
Col. 4, line 2, change "ANd" to --AND--.
       line 6, change "be" to --by--.
       line 37, change "on" to --of--.
Col. 5, line 21, change "non-volatile" to --FIG.--.
       line 53, between "each" and "one", insert --and--.
Col. 6, line 4, change "gate" to --gates--.
       line 19, change "of" to --a--.
       line 20, between "referring" and "to", insert --again--.
       line 44, change "clip" to --chip--.
Col. 7, line 37, change "and" to --an--.
       line 41, change "location" to --locations--.
       line 67, delete "and"
              between "means" and "ADD", insert --for providing an--.
Col. 8, line 18, change "presense" to --presence--.
       line 21, change "by" to --for--.

UNITED STATES PATENT AND TRADEMARK OFFICE
CERTIFICATE OF CORRECTION

PATENT NO. : 4,032,765
DATED : June 28, 1977
INVENTOR(S) : Jeffrey E. Epstein and Gary V. Ruby It is certified that error appears in the above-identified patent and that said Letters Patent are hereby corrected as shown below:

(Continued)

Col. 9, line 2, change "signal", second occurrence, to --signals--.
       line 53, change "need" to --needs--.
       line 63, change "includes" to --include--.
Col. 10, line 1, delete "receive", second occurrence.
       line 10, change "to" to --of--.
       line 11, after "clause", insert --(g)--.
       line 13, change "correct" to --corrected--.
       line 26, change "signal" to --signals--.
       line 27, delete "signals", second occurrence.
       line 55, change "gate" to --gates--.
       line 61, between "inserting" and "data", insert --the desired--.
       line 62, between "inserting" and "desired", insert --the--.
       line 67, change "and" to --an--.
Col. 11, line 3, change "and" to --from--.

Signed and Sealed this

Twentieth Day of September 1977

[SEAL]

Attest:

RUTH C. MASON
*Attesting Officer*

LUTRELLE F. PARKER
*Acting Commissioner of Patents and Trademarks*